United States Patent
Lee et al.

[11] Patent Number: 6,071,769
[45] Date of Patent: Jun. 6, 2000

[54] METHOD FOR FORMING A RESISTOR LOAD OF A STATIC RANDOM ACCESS MEMORY

[75] Inventors: Tzung-Han Lee, Taipei; Han Lin, Hsinchu, both of Taiwan

[73] Assignee: United Microelectronics Corp., Taiwan

[21] Appl. No.: 08/998,602

[22] Filed: Dec. 29, 1997

[30] Foreign Application Priority Data

Oct. 20, 1997 [TW] Taiwan .................................. 86115425

[51] Int. Cl.[7] .............................................. H01L 21/8234
[52] U.S. Cl. ........................ 438/238; 438/238; 438/200; 438/355
[58] Field of Search .................... 438/238, 241, 438/953, 152, 153

[56] References Cited

U.S. PATENT DOCUMENTS 5,719,079  2/1998  Yoo ......................................... 438/238
5,770,496  6/1998  Roberts ................................... 438/238
5,866,451  2/1999  You et al. ............................... 438/241

Primary Examiner—David Nelms
Assistant Examiner—Pho Luu
Attorney, Agent, or Firm—Rabin & Champagne, P.C.

[57] ABSTRACT

A method for manufacturing SRAM loads comprising the steps of sequentially forming a silicon oxide layer and a silicon nitride layer over a polysilicon layer. Then, the silicon oxide layer and the silicon nitride layer are patterned to form vias exposing a load region. Thereafter, using a thermal oxidation operation, an oxide layer is formed above the load region. Subsequently, the silicon nitride layer and the silicon oxide layer are removed. Through the formation of an oxide layer over the load region, the cross-sectional thickness and width of the load are reduced, thereby moderating the out-diffusion of ions while maintaining the load resistance. Furthermore, the oxide layer, which forms over the load region in the back-end process, can serve as a barrier layer preventing the out-diffusion of ions and blocking incoming moisture.

15 Claims, 4 Drawing Sheets

METHOD FOR FORMING A RESISTOR LOAD OF A STATIC RANDOM ACCESS MEMORY

BACKGROUND OF THE INVENTION

1. Field of Invention

The present invention relates to a method for manufacturing integrated circuits. More particularly, the present invention relates to a method for forming a load of a static random access memory (SRAM) that facilitates the reduction of device dimensions and an increase in level of integration.

2. Description of Related Art

Static random access memories (SRAMs) are now extensively used in integrated circuits, especially in the telecommunication and electronic industries. Therefore, how to reduce device dimensions, how to increase the level of integration without compromising the quality are some of the major research topics in the production industry. Polysilicon loads are one of the basic elements in a SRAM cell. The polysilicon loads serve as resistor in the circuit, and normally form by doping very low concentration ions or not doping ions on a line segment of a polysilicon line. Moreover, interconnects are formed on the same polysilicon lines by specifically doping a heavier concentration of ions on a particular line segment.

FIG. 1 is a circuit layout diagram of a conventional four-transistor static random access memory (4T SRAM). As shown in FIG. 1, $R_1$ and $R_2$ are load resistors, and $M_1$ and $M_2$ are enhancement mode NMOS transistors that function as drivers. Furthermore, enhancement mode NMOS $M_3$ and $M_4$ are used for accessing data in the SRAM. The gates of transistor $M_3$ and $M_4$ are controlled by a horizontal conductive line referred to as a word line (WL). The drain terminals of $M_3$ and $M_4$ are connected to transistor drivers $M_1$ and $M_2$, respectively. Therefore, the ON and OFF state of the transistors $M_1$ and $M_2$ are closely related to the switching states of transistors $M_3$ and $M_4$. The source terminals of $M_3$ and $M_4$ are each connected to a vertical conducting line referred to as a bit line (BL).

In general, for the 4T SRAM, the same polysilicon layer is used to form interconnects and loads. To form an interconnect, the desired segment on the polysilicon line is heavily doped, and to form a load, the desired segment on the polysilicon line is lightly doped or not doped at all. Since the loads and the interconnects are formed on the same polysilicon lines in a conventional production method, thickness of both the interconnect lines and the load lines are almost the same.

FIG. 2 is a cross-sectional view showing a conventional polysilicon load structure. As shown in FIG. 2, a gate polysilicon element 12 and a power line polysilicon element 14 is formed over a substrate 10. Then, an insulating layer 16 is deposited over the substrate 10. This is followed by etching the insulating layer 16 to form contact window 17a that exposes the gate polysilicon element 12, and contact window 17b that exposes the power line polysilicon element 14. Thereafter, a polysilicon layer is formed over the insulating layer 16 and into the contact windows 17a and 17b. Subsequently, an ion doping operation using a low ion concentration level is performed to form a polysilicon load line in area 18. Next, a second ion doping operation is performed, this times using a higher ion concentration to form the interconnections in area 20a and 20b.

In general, the conventional method of producing a high load resistance is by decreasing the thickness of polysilicon layer, increasing the length of the polysilicon load line, or reducing the width of the polysilicon load line. However, when the SRAM cells are further miniaturized, the aforementioned method of using the same polysilicon layer to fabricate interconnects and loads by variation the doping concentrations on different polysilicon line segments in two doping operations becomes infeasible. The main reason is that during subsequent thermal processing operations, the large amount of doped impurities from the second implant will out-diffuse from the interconnects and reduce the effective length of the polysilicon load line. Thus, the resistance of the load line is lowered and the current flow in them increased. Furthermore, the diffusion of ions will lead to difficulties in controlling the quality of the product. This is an especially difficult problem! for the conventional method. Because, if we want to extend the length of the polysilicon load line, there is no more space due to the miniaturization of memory cells. On the other hand, if the load resistance is increased through reducing the width of a polysilicon load line, it is difficult to avoid increasing the resistance of the interconnect as well. This is because the interconnections and the loads are formed along the same polysilicon line. Therefore, the conventional method of forming the polysilicon load line is a major limitation for the miniaturization of the memory cells.

In light of the foregoing, there is a need in the art to provide an improved method of manufacturing load resistors for SRAM cells.

SUMMARY OF THE INVENTION

Accordingly, the present invention is directed to provide a method for manufacturing SRAM load lines having a reduced cross-sectional thickness and width, and able to decrease the out-diffusion of ions. Therefore, the effective length of a load line can be maintained, and dimensions of the device can be further miniaturized.

To achieve these and other advantages and in accordance with the purpose of the invention, as embodied and broadly described herein, the invention provides a method for forming SRAM loads. The method comprises the steps of sequentially forming a silicon oxide layer and a silicon nitride layer over a polysilicon layer. Then, using a photomask, the silicon oxide layer and the silicon nitride layer are etched to form vias exposing the load regions. Thereafter, using a thermal oxidation operation, an oxide layer is formed over the load regions. Subsequently, the silicon nitride layer and the silicon oxide layer are removed. Through the formation of an oxide layer over the load regions, the cross-sectional thickness and width of the load regions are reduced, thereby moderating the out-diffusion of ions while maintaining the resistance in the load regions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
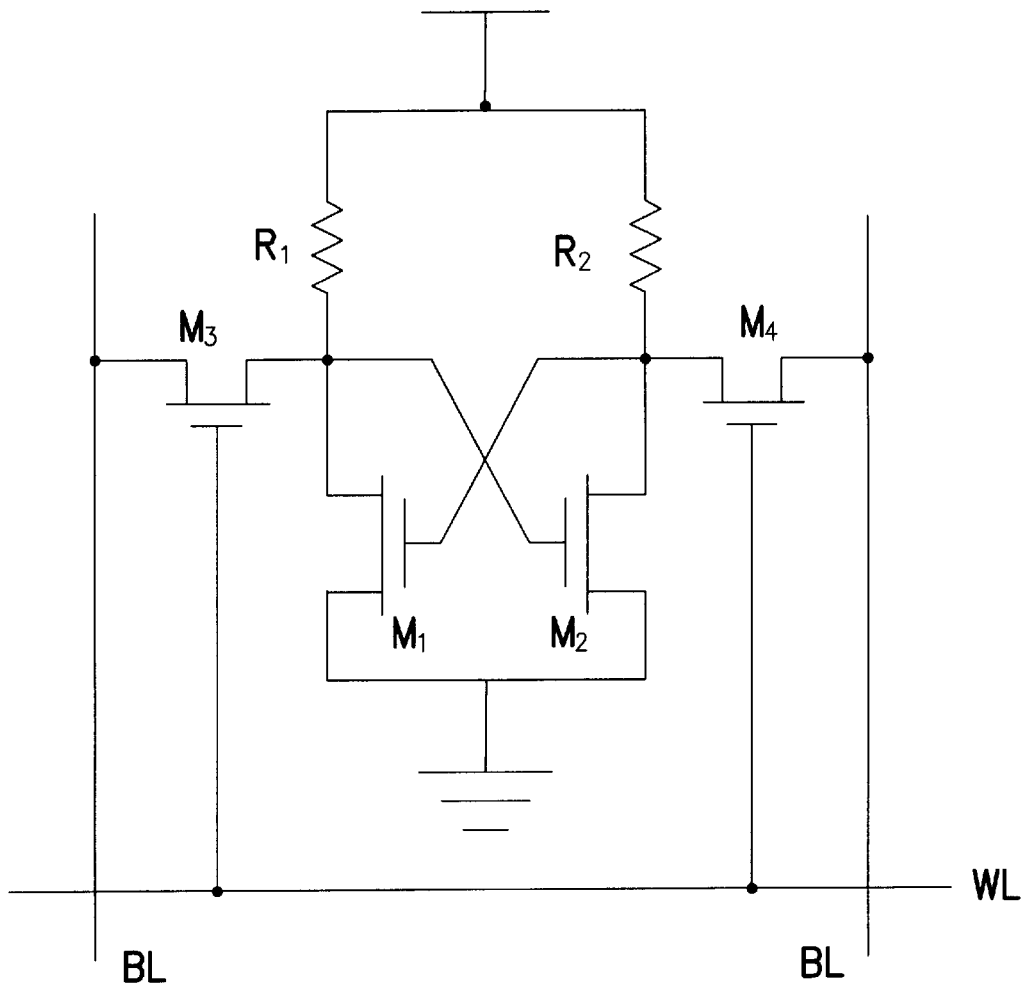
FIG. 1 is a circuit layout diagram of a conventional four-transistor static random access memory (4T SRAM)
Figure 2:
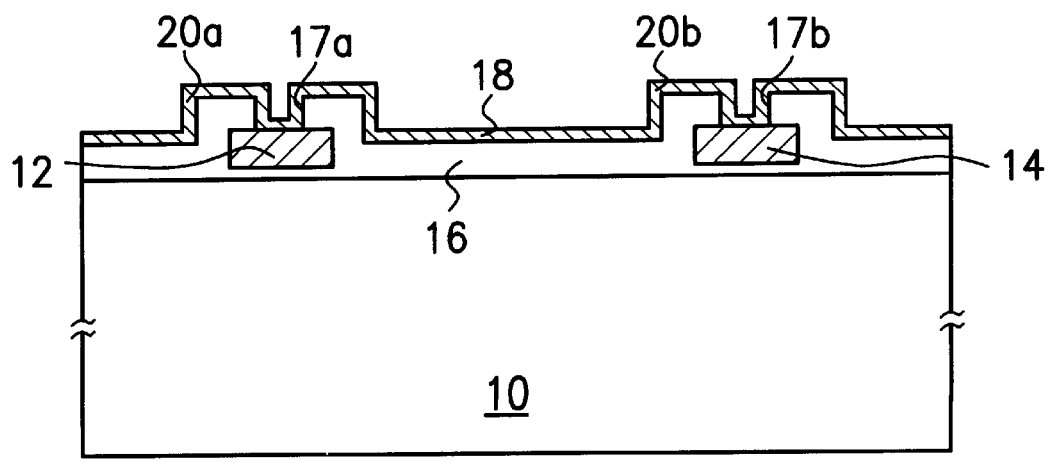
FIG. 2 is a cross-sectional view showing a conventional polysilicon load structure.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
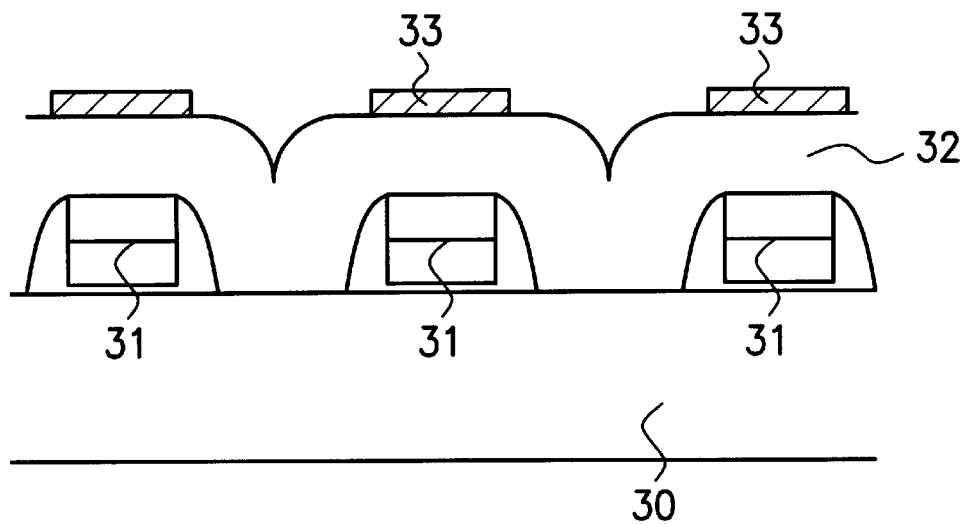
FIGS. 3A through 3D are cross-sectional views showing the progression of manufacturing steps in reducing the width of load lines according to one preferred embodiment of this invention.

FIGS. 3A through 3D are cross-sectional views showing the progression of manufacturing steps in reducing the width of load lines according to one preferred embodiment of this invention. First, as shown in FIG. 3A, a gate device region 31 is formed over a substrate 30. Then, a dielectric layer 32 and a polysilicon layer are sequentially formed over the substrate 30. The polysilicon layer is then patterned to form the respective load regions 33 and interconnect regions. In FIG. 3A, the interconnect regions are located behind the load regions 33.

Figure 3B:
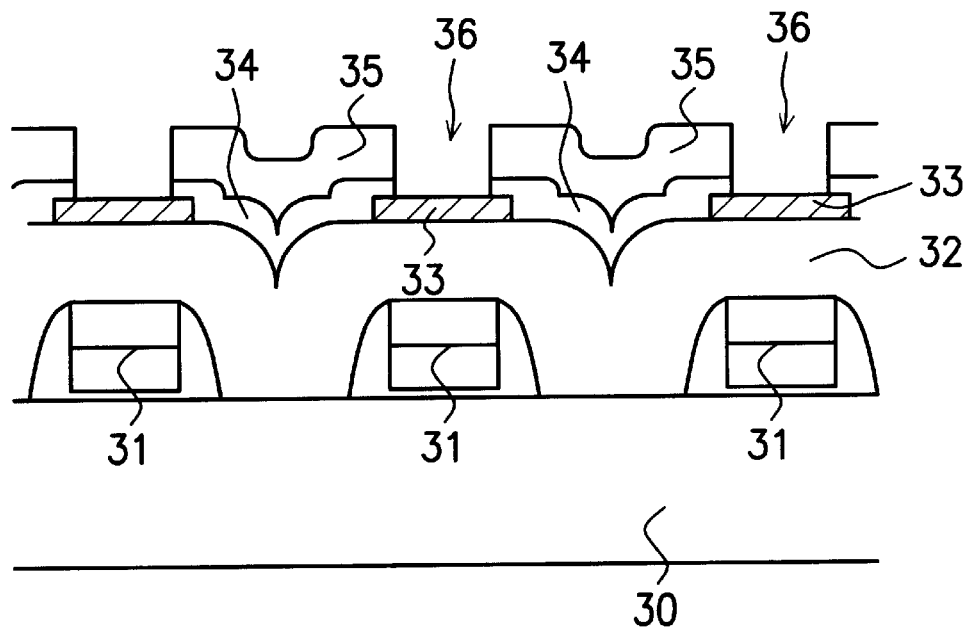

Next, as shown in FIG. 3B, a first silicon oxide layer 34 and a silicon nitride layer 35 are sequentially formed over the structure shown in FIG. 3A. The ratio of thickness between the silicon nitride layer and the first silicon oxide layer is preferably 7:1. The method of forming the oxide layer 34 and the silicon nitride layer 35 includes using a chemical vapor deposition method. Thereafter, a photoresist layer is formed over the silicon nitride layer 35. The photomask layer is patterned and then an etching operation is performed to remove a portion of the silicon nitride layer 35 and the first silicon oxide layer 34, forming vias 36 that expose the polysilicon load regions 33. The vias 36 can either expose only a portion of the load region 33 or the whole load region 33.

Figure 3C:
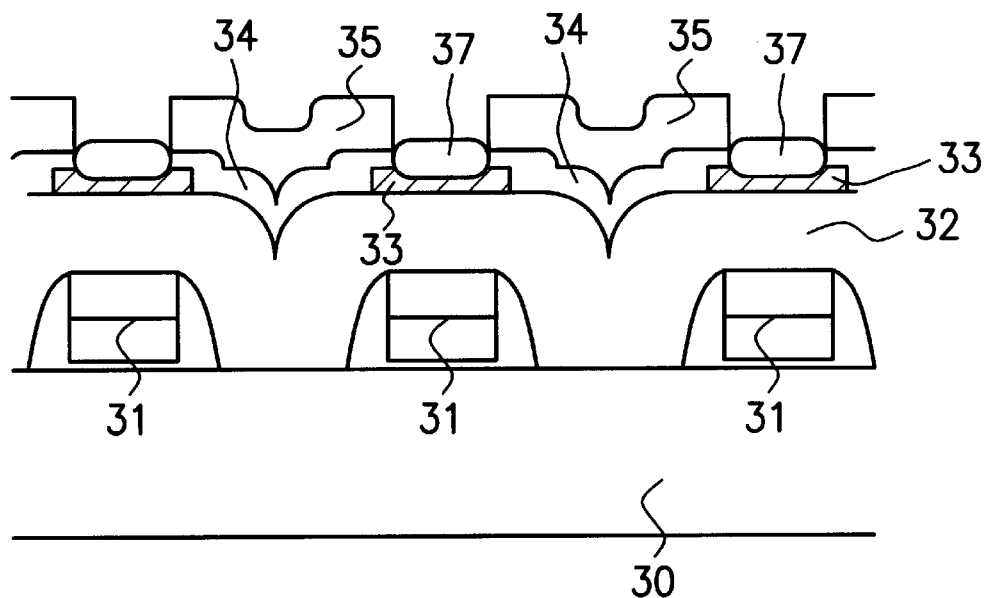

Subsequently, as shown in FIG. 3C, a second silicon oxide layer 37 is formed over the exposed load regions 33. The second silicon oxide layer 37 can be formed by a thermal oxidation process such that the polysilicon in the polysilicon load regions 33 reacts with oxygen to form a silicon dioxide layer. Since the source of silicon for the formation of silicon dioxide comes directly from the polysilicon layer, the silicon oxide layer thus grown will be partially buried in the polysilicon layer.

Figure 3D:
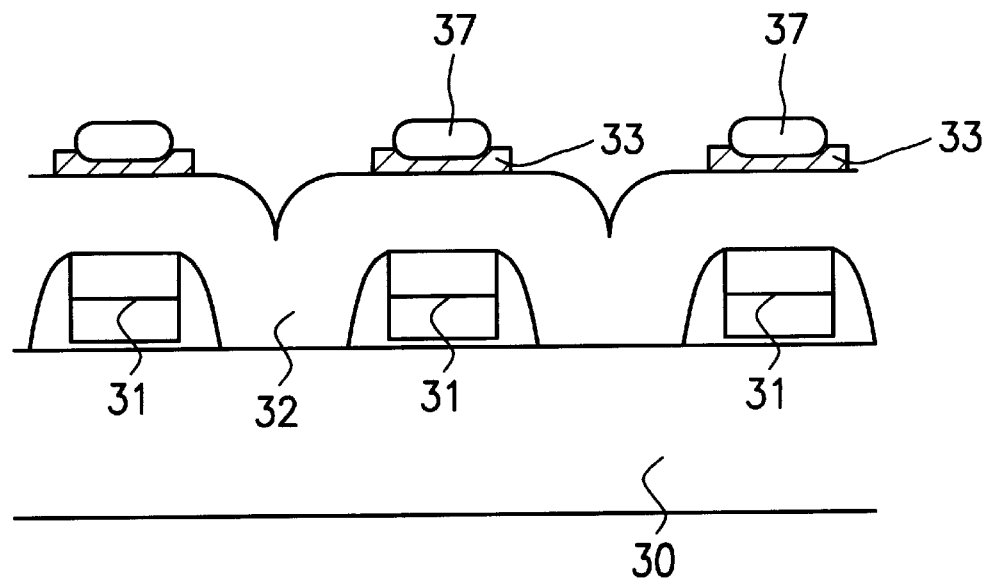
Figure 4:
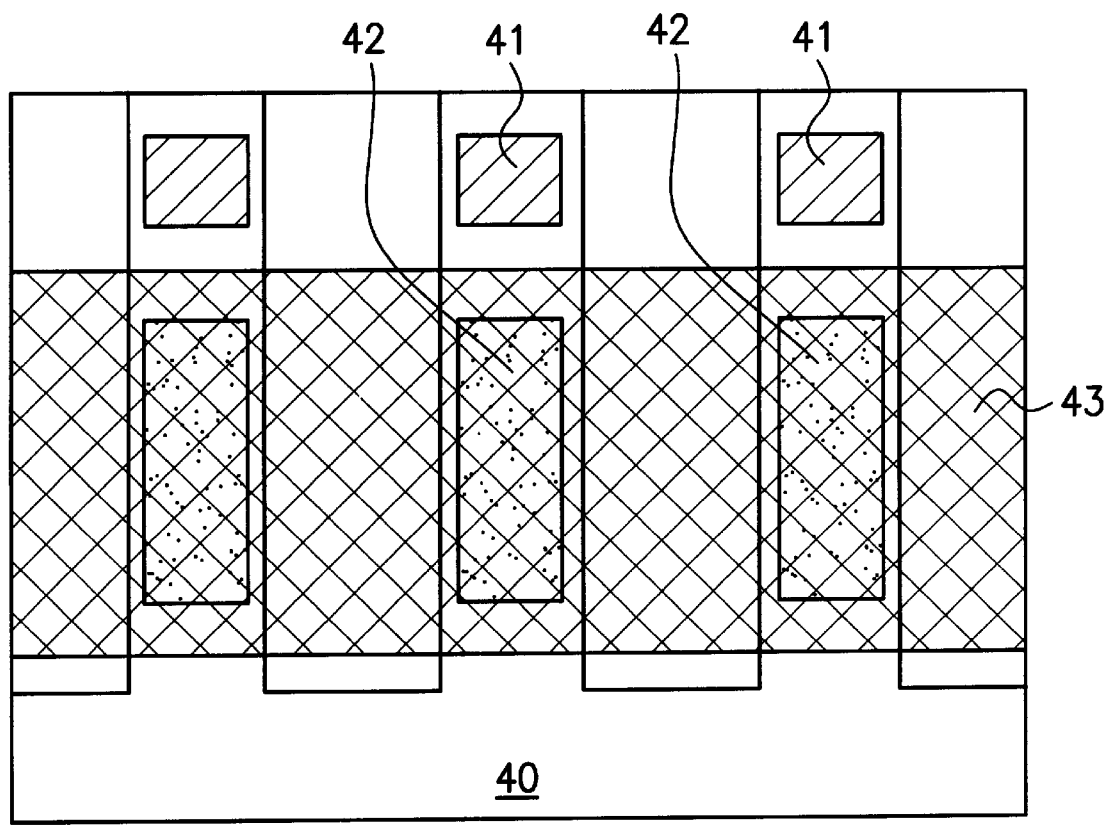
FIG. 4 is a plan view showing a photomask on top for performing a doping operation according to one preferred embodiment of this invention.

Next, the silicon nitride layer 35 and the first silicon oxide layer 34 are removed forming the structure as shown in FIG. 3D. FIG. 4 shows a plan view of the substrate having a photomask on top ready for performing a doping operation. As shown in FIG. 4, on top of an area having SRAM devices 40, vias 41 and oxidation windows 42 for defining the load regions are already formed thereon. Furthermore, a photomask 43 has already formed over the load regions of the device area 40. In the subsequent step, an ion implantation operation is carried out to implant ions into the area outside the photomask 43 where the desired interconnects are located. Hence, the interconnections will received a high concentration of ions for increasing its electrical conductivity.

The ion implantation can be carried out after the formation of the second silicon oxide layer on the load regions as described above, or before the formation of second silicon oxide. In other words, the ion implantation is performed to dope different amount of ions into the respective load regions and interconnect regions first, before carrying out the thermal oxidation to form the second silicon oxide layer over the load regions. Through controlling the quantity of oxide in the second silicon oxide layer formed by the reaction, cross-sectional thickness and width of the load line can be set. Because the second silicon oxide layer is partially buried inside the load region, width of the load region is reduced. Hence, the out-diffusion of ions is effectively slowed, and the problem of a shortening of the effective load length due to out-diffusion is greatly improved.

The characteristic of this invention is the growing of an oxide layer directly over the load region so that the cross-sectional thickness and width of the load line can be precisely controlled. Through a reduction in the width of a load line, the resistance of the load line can be increased or the device dimensions can be further miniaturized.

Another characteristic of this invention is that the oxide layer, which forms over the load line in the back-end process, can serve as a barrier layer. The oxide layer prevents the out-diffusion of ions and blocking away moisture, thereby maintaining a constant value for the load resistance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a load of static random access memory, comprising the steps of:

providing a substrate having a plurality of gate devices formed thereon, and a dielectric layer and a polysilicon layer formed over the gate devices and substrate;

patterning the polysilicon layer to form a load region and an interconnect region;

forming a first silicon oxide layer over the polysilicon layer;

forming a silicon nitride layer over the first silicon oxide layer;

performing photolithographic and etching processes to remove a portion of the silicon nitride layer and the first silicon oxide layer, forming a via that exposes the load region;

forming a second silicon oxide layer above the load region; and removing the silicon nitride layer and the first silicon oxide layer.

2. The method of claim 1, wherein the first silicon oxide layer is formed by chemical vapor deposition.

3. The method of claim 1, wherein the silicon nitride layer is formed by chemical vapor deposition.

4. The method of claim 1, wherein the ratio of thickness between the silicon nitride layer and the first silicon oxide layer is preferably 7:1.

5. The method of claim 1, wherein the step of performing photolithographic and etching processes to remove a portion of the silicon nitride layer and the first silicon oxide layer further includes the steps of:

forming a photoresist layer over the silicon nitride layer;

patterning the photoresist layer, then etching to remove a portion of the silicon nitride layer and the first silicon oxide layer forming a via that exposes the load region; and removing the photoresist layer.

6. The method of claim 1, wherein the step of forming the second silicon oxide layer includes using a thermal oxidation method.

7. The method of claim 1, wherein the step of forming the via includes etching to expose part of the load region.

8. The method of claim 1, wherein the step of forming the via includes etching to expose the whole load region.

9. A method for forming a load of static random access memory, comprising the steps of:

provideing a substrate having a plurality of gate devices already formed thereon, and a dielectric layer and a polysilicon layer formed over the gate devices and substrate;

patterning the polysilicon layer to form a load region and an interconnect region;

forming a first silicon oxide layer over the polysilicon layer;

forming a silicon nitride layer over the first silicon oxide layer;

forming a photoresist layer over the silicon nitride layer;

patterning the photoresist layer, then etching to remove a portion of the silicon nitride layer and the first silicon oxide layer forming a via that exposes the load region;

removing the photoresist layer;

forming a second silicon oxide layer above the load region; and removing the silicon nitride layer and the first silicon oxide layer.

10. The method of claim 9, wherein the first silicon oxide layer is formed by chemical vapor deposition.

11. The method of claim 9, wherein the silicon nitride layer is formed by chemical vapor deposition.

12. The method of claim 9, wherein the ratio of thickness between the silicon nitride layer and the first silicon oxide layer is preferably 7:1.

13. The method of claim 9, wherein the step of forming the second silicon oxide layer includes using a thermal oxidation method.

14. The method of claim 9, wherein the step of forming the via includes etching to expose part of the load region.

15. The method of claim 9, wherein the step of forming the via includes etching to expose the whole load region.

\* \* \* \* \*